(12) United States Patent
Kakimoto et al.

(10) Patent No.: US 9,093,667 B2
(45) Date of Patent: Jul. 28, 2015

(54) METHOD FOR PRODUCING ELECTROLUMINESCENCE DEVICE

(75) Inventors: Hidenobu Kakimoto, Ibaraki (JP); Haruka Kusukame, Nara (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 13/981,966

(22) PCT Filed: Feb. 1, 2012

(86) PCT No.: PCT/JP2012/052247
§ 371 (c)(1),
(2), (4) Date: Jul. 26, 2013

(87) PCT Pub. No.: WO2012/105600
PCT Pub. Date: Aug. 9, 2012

(65) Prior Publication Data
US 2013/0306953 A1 Nov. 21, 2013

(30) Foreign Application Priority Data
Feb. 2, 2011 (JP) .................................. 2011-020872

(51) Int. Cl.
*H01L 51/56* (2006.01)
*H01L 51/50* (2006.01)
*H01L 51/00* (2006.01)

(52) U.S. Cl.
CPC ............ *H01L 51/56* (2013.01); *H01L 51/0003* (2013.01); *H01L 51/0026* (2013.01); *H01L 51/50* (2013.01); *H01L 51/0039* (2013.01); *H01L 51/0085* (2013.01)

(58) Field of Classification Search
USPC ..................................................... 438/46, 49
See application file for complete search history.

(56) References Cited

U.S. PATENT DOCUMENTS

| | | | | |
|---|---|---|---|---|
| 7,766,712 | B2 * | 8/2010 | Ishida .............................. | 445/23 |
| 7,888,170 | B2 * | 2/2011 | Miyata et al. ................... | 438/99 |
| 2003/0175414 | A1 * | 9/2003 | Hayashi .......................... | 427/66 |
| 2007/0093167 | A1 * | 4/2007 | Ishida .............................. | 445/24 |

(Continued)

FOREIGN PATENT DOCUMENTS

| | | |
|---|---|---|
| JP | 2002-352954 | 12/2002 |
| JP | 2006-185864 | 7/2006 |

(Continued)

OTHER PUBLICATIONS

International Search Report (ISR) in International Application No. PCT/JP2012/052247, dated Feb. 28, 2012.

(Continued)

*Primary Examiner* — Lex Malsawma
(74) *Attorney, Agent, or Firm* — Greenblum & Bernstein, P.L.C.

(57) ABSTRACT

A method is provided for producing an organic EL device, capable of producing an organic EL device having a long light emission life, an organic EL device produced by the production method, and a planar light source, a lightening system and a display device each having the organic EL device. Included is a method for producing an organic electroluminescence device including a first electrode; a second electrode; and an organic layer including an organic compound provided between the first and second electrodes. The organic layer is formed by a method including an organic thin film forming step of forming, by coating, an organic thin film including an organic compound on a surface of a layer on which the organic layer is formed, under low-humidity; and an organic thin film storing step of storing the organic thin film obtained by the organic thin film forming step, under high-humidity.

23 Claims, 2 Drawing Sheets

(56) References Cited

U.S. PATENT DOCUMENTS

| | | |
|---|---|---|
| 2008/0100205 A1 | 5/2008 | Junke et al. |
| 2010/0078632 A1* | 4/2010 | Miyata et al. ............. 257/40 |
| 2011/0069495 A1 | 3/2011 | Hayasi et al. |
| 2011/0147904 A1 | 6/2011 | Sano |
| 2013/0344635 A1* | 12/2013 | Shitagaki et al. ............. 438/46 |

FOREIGN PATENT DOCUMENTS

| | | |
|---|---|---|
| JP | 2007-122914 | 5/2007 |
| JP | 2007-234293 | 9/2007 |
| JP | 2008-235196 | 10/2008 |
| JP | 2009-266814 | 11/2009 |

OTHER PUBLICATIONS

International Preliminary Report on Patentability (IPRP) in International Application No. PCT/JP2012/052247, dated Aug. 15, 2013.

Written Opinion (WO) in International Application No. PCT/JP2012/052247, dated Feb. 28, 2012.

* cited by examiner

METHOD FOR PRODUCING ELECTROLUMINESCENCE DEVICE

TECHNICAL FIELD

The present invention relates to a method for producing an organic electroluminescence device.

BACKGROUND ART

In recent years, an organic EL display (hereinafter, referred to as an "organic EL display") using an organic electroluminescence device (hereinafter, referred to as an "organic EL device") has received attention. An organic EL device that is used in an organic EL display includes an anode, a cathode and a light emitting layer placed between the anode and the cathode, wherein light is emitted as a hole and an electron injected from the anode and the cathode, respectively, are combined in the light emitting layer.

An organic EL device has the advantage that a production process is simple, and an organic layer such as a light emitting layer or the like can be formed by a coating method with which the area of a device is easily increased. Specifically, an organic layer can be formed using a solution including an organic compound contained in the organic layer, and an organic solvent. As for a method for forming an organic layer of an organic EL device, there have been proposed a method for producing an organic EL device, wherein concentration of moisture in an atmosphere for forming a light emitting layer is 1000 ppm or less (Patent Document 1), and a method for producing an organic EL device, wherein an organic layer is prepared by a wet process in an inert gas atmosphere having a moisture content of 10 ppm or less and an oxygen concentration of 10 ppm or less (Patent Document 2).

BACKGROUND ART DOCUMENTS

Patent Documents

Patent document 1: Japanese Patent Laid-open Publication No. 2002-352954
Patent document 2: Japanese Patent Laid-open Publication No. 2006-185864

SUMMARY OF THE INVENTION

Problems to be Solved by the Invention

However, an organic EL device produced by the above-described method does not necessarily have a sufficient light emission life, and a method capable of producing an organic EL device having a longer light emission life has been desired.

An object of the present invention is to provide a method capable of producing an organic EL device having a long light emission life, an organic EL device produced by the method, and a planar light source, a lightening system and a display device each having the organic EL device.

Means for Solving the Problems

The present invention provides a method for producing an organic EL device comprising: a first electrode; a second electrode; and an organic layer provided between the first electrode and the second electrode, the organic layer comprising an organic compound, wherein the organic layer is formed by a method comprising:

an organic thin film forming step of forming, by a coating method, an organic thin film including an organic compound on a surface of a layer on which the organic layer is formed, under a low-humidity atmosphere having a moisture concentration of 10 ppm or less in terms of a volume; and an organic thin film storing step of storing the organic thin film obtained by the organic thin film forming step, under a high-humidity atmosphere having an absolute humidity of $2.0 \times 10^{-3}$ kg/kg (dry air) or more in terms of a weight.

In one embodiment, the high-humidity atmosphere has an absolute humidity of $2.0 \times 10^{-3}$ kg/kg (dry air) or more and $2.0 \times 10^{-2}$ kg/kg (dry air) or less in terms of a weight.

In one embodiment, the high-humidity atmosphere has an absolute humidity of $5.0 \times 10^{-3}$ kg/kg (dry air) or more and $1.5 \times 10^{-2}$ kg/kg (dry air) or less in terms of a weight.

In one embodiment, the low-humidity atmosphere contains an inert gas.

In one embodiment, the low-humidity atmosphere has an oxygen concentration of 10 ppm or less in terms of a volume.

In one embodiment, the organic thin film forming step and organic thin film storing step are performed by passing a substrate sequentially through a space of atmosphere for performing the organic thin film forming step, a buffer space and a space of atmosphere for performing the organic thin film storing step, and atmospheric pressure of the buffer space is negative pressure as compared to each of the space for performing the organic thin film forming step and the space for performing the organic thin film storing step.

In one embodiment, the organic thin film forming step and organic thin film storing step are performed by passing a substrate sequentially through a space of atmosphere for performing the organic thin film forming step and a space of atmosphere for performing the organic thin film storing step, and atmospheric pressure of the space for performing the organic thin film forming step is positive pressure as compared to the space for performing the organic thin film storing step.

In one embodiment, the method comprises a step of baking an organic thin film subsequently to the organic thin film storing step.

In one embodiment, the step of baking an organic thin film is performed under an atmosphere containing an inert gas.

In one embodiment, the step of baking an organic thin film is performed under an atmosphere having an oxygen concentration of 10 ppm or less and a moisture concentration of 10 ppm or less in terms of a volume.

In one embodiment, the step of baking an organic thin film is performed under a reduced-pressure atmosphere having a pressure of 10 Pa or less.

In one embodiment, the first electrode is an anode, and the second electrode is a cathode.

In one embodiment, the organic layer comprises a polymer organic compound.

In one embodiment, the organic layer is a light emitting layer.

In one embodiment, the organic layer comprises a phosphorescent light emitting compound.

In one embodiment, the method further comprises a step of forming a functional layer in contact with the light emitting layer.

In one embodiment, the functional layer is formed between the light emitting layer and the first electrode.

In one embodiment, the functional layer comprises a polymer organic compound.

The present invention also provides an organic EL device produced by any one of the aforementioned methods for producing an organic EL device.

The present invention also provides a planar light source comprising the organic EL device.

The present invention also provides a display device comprising the organic EL device.

Effects of the Invention

According to a method for producing an organic EL device according to the present invention, an organic EL device having long light emission life can be produced. Further, the organic EL device is suitably used for flat or curved planar light sources for use in lightening and the like; display devices such as segment display devices, dot matrix display devices and the like; and backlights of liquid crystal display devices and the like.

EMBODIMENT FOR CARRYING OUT THE INVENTION

Figure 1:
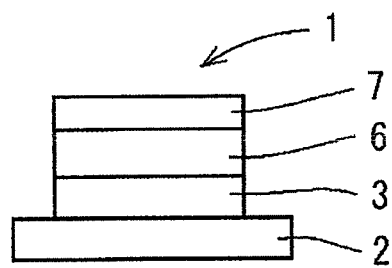
FIG. 1 is a view showing a structure of one aspect of an organic EL device.

FIG. 1 is a view schematically showing one embodiment of an organic EL device produced by a method of the present invention. An organic EL device 1 is provided on a substrate 2, and includes a first electrode 3, a second electrode 7 and an organic layer 6 provided between the first electrode and the second electrode. The organic layer 6 contains an organic compound. For typical functions of the layers that form the organic EL device 1, the first electrode 3 is an anode, the second electrode 7 is cathode, and the organic layer 6 is a light emitting layer.

(Method for Forming an Organic Layer)

A method for forming the organic layer 6 will be described below using as an example the organic EL device 1 shown in FIG. 1. The organic layer 6 is formed by a method including an organic thin film forming step of forming on the first electrode 3 an organic thin film which is a thin film containing an organic compound, and an organic thin film storing step of storing the obtained organic thin film under a high-humidity atmosphere. Details of other constitutional components of the organic EL device 1 will be described later.

First, the organic thin film forming step will be described.

Formation of the thin film containing an organic compound may be performed in the same manner as heretofore, and is preferably performed using a coating method in which a production process is simple, and the area of a device is easily increased. The coating method is performed under a low-humidity atmosphere having a moisture concentration of 10 ppm or less, preferably 5 ppm or less, more preferably 1 ppm or less in terms of a volume. By doing so, device characteristics of the organic EL device are improved.

Namely, by performing formation of the organic thin film under an environment having a small moisture content, an uptake of moisture into the organic thin film is decreased, so that function deterioration of the organic compound is prevented.

Preferably the organic thin film is formed under atmospheric pressure or in an atmosphere containing an inert gas from the viewpoint of device characteristics of the organic EL device. Examples of the inert gas may include a helium gas, an argon gas, a nitrogen gas, a mixed gas thereof and the like, and among them, a nitrogen gas is preferable from the viewpoint of ease of preparing the device.

The organic thin film may be formed under an air atmosphere, or may be formed under an atmosphere where concentration of an inert gas in the atmosphere is equal to or more than concentration of an inert gas contained in the air atmosphere.

The organic thin film is formed preferably under an atmosphere having an oxygen concentration of 1000 ppm or less in terms of a volume, more preferably under an atmosphere having an oxygen concentration of 100 ppm or less in terms of a volume, further preferably under an atmosphere having an oxygen concentration of 10 ppm or less in terms of a volume, from the viewpoint of life characteristics of the device.

A solvent used for forming the organic thin film by a coating method is not particularly limited as long as it is liquid at 1 atm and at 25° C., but the solvent is preferably a compound composed of two or more kinds of atoms selected from the group consisting of a carbon atom, a hydrogen atom, an oxygen atom, a nitrogen atom and a sulfur atom, more preferably a compound composed of two or more kinds of atoms selected from the group consisting of a carbon atom, a hydrogen atom, an oxygen atom and a nitrogen atom, further preferably a compound composed of two or more kinds of atoms selected from the group consisting of a carbon atom, a hydrogen atom and an oxygen atom.

Examples of the organic solvent include a halogenated solvent, a hydrocarbon solvent, an aromatic hydrocarbon solvent, an ether solvent, an alcohol solvent, a ketone solvent, a nitrile solvent, a sulfoxide solvent, an amide solvent and water. Two or more organic solvents may be combined and used.

Specific examples of the halogenated solvent include carbon tetrachloride, methylene chloride, chloroform, dichloroethane, tetrachloroethylene, chlorobenzene, bis(2-chloroethyl)ether, chloromethyl ethyl ether, chloromethyl methyl ether, 2-chloroethyl ethyl ether and 2-chloroethyl methyl ether.

Specific examples of the hydrocarbon solvent include pentane, hexane, cyclohexane, heptane, octane, decahydronaphthalene, petroleum ether and ligroin.

Specific examples of the aromatic hydrocarbon solvent include benzene, toluene, xylene, ethylbenzene, cumene, pseudocumene, trimethylbenzene, butylbenzene, tetramethylbenzene, tert-butylbenzene, hexylbenzene, heptylbenzene, octylbenzene, nonylbenzene, decatylbenzene, tetralin, cyclohexylbenzene, decalin and methylnaphthalene.

Examples of the ether solvent include diethyl ether, ethyl propyl ether, dipropyl ether, diisopropyl ether, dibutyl ether, methyl tert-butyl ether, anisole, methyl anisole, diphenyl ether; phenoxy toluene, phenoxy xylene, ditolyl ether, tetrahydrofuran, dihydrofuran, dioxane, tetrahydropyran, 4-methyl-1,3-dioxane and 4-phenyl-1,3-dioxane.

Specific examples of the alcohol solvent include methanol, ethanol, 1-propanol, 2-propanol, 1-butanol, 2-butanol, 2-methyl-1-propanol, 2-methyl-2-propanol, 1-pentanol, 2-pentanol, 3-pentanol, 2,2-dimethyl-1-propanol, 1-hexanol, cyclopentanol, 3-methyl-1-butanol, 3-methyl-2-butanol, 2-methyl-1-butanol, 2,2-dimethyl-1-propanol, 3-hexanol, 2-hexanol, 4-methyl-2-pentanol, 2-methyl-1-pentanol, 2-ethyl butanol, 2,4-dimethyl-3-pentanol, 3-heptanol, 4-heptanol, 2-heptanol, 1-heptanol, 2-ethyl-1-hexanol, 2,6-dimethyl-4-heptanol, 2-methyl cyclohexanol, 3-methyl cyclohexanol and 4-methyl cyclohexanol.

Specific examples of the ketone solvent include acetone, methyl ethyl ketone, methyl iso-butyl ketone, cyclohexanone, isopropyl methyl ketone, 2-pentanone, 3-pentanone, 3-hexanone, diisopropyl ketone, 2-hexanone, cyclopentanone, 4-heptanone, isoamyl methyl ketone, 3-heptanone, 2-heptanone, 4-methoxy-4-methyl-2-pentanone, 5-methyl-3-heptanone, 2-methyl cyclohexanone, diisobutyl ketone, 5-methyl-2-octanone, 3-methylcyclohexanone, 2-cyclohexene-1-one, 4-methylcyclohexanone, cycloheptanone, 4-tert-butyl cyclohexanone and benzylacetone.

Specific examples of the nitrile solvent include acetonitrile, acrylonitrile, trichloroacetonitrile, propionitrile, pivalonitrile, isobutyronitrile, n-butyronitrile, methoxyacetonitrile, 2-methylbutyronitrile, isovaleronitrile, N-valeronitrile, n-capronitrile, 3-methoxypropionitrile, 3-ethoxypropionitrile, 3,3'-oxydipropionitrile, n-heptanitrile, glycolonitrile, benzonitrile, ethylene cyanohydrin, succinonitrile, acetone cyanohydrin and 3-n-butoxypropionitrile.

Specific examples of the sulfoxide solvent include dimethyl sulfoxide, di-n-butyl sulfoxide, tetramethylene sulfoxide and methylphenyl sulfoxide.

Specific examples of the amide solvent include dimethylformamide, dimethylacetamide, acylamide, 2-acetamide ethanol, N,N-dimethyl-m-toluamide, trifluoroacetamide, N,N-dimethylacetamide, N,N-diethyldodecaneamide, epsilon-caprolactam, N,N-diethylacetamide, N-tert-butylformamide, formamide, pivalamide, N-butylamide, N,N-dimethylacetacetamide, N-methylformamide, N,N-diethylformamide, N-formylethylamine, acetamide, N,N-diisopropylformamide, 1-formylpiperidine, N-methylformanilide and N-methylpyrrolidone.

When two organic solvents are included, it is preferable that one solvent is a solvent having a boiling point of 180° C. or higher, and the other solvent is a solvent having a boiling point of 180° C. or lower, and it is more preferable that one solvent is a solvent having a boiling point of 200° C. or higher, and the other solvent is a solvent having a boiling point of 180° C. or lower, from the viewpoint of film formability.

When three organic solvents are included, it is preferable that among the three solvents, at least one solvent is a solvent having a boiling point of 180° C. or higher, and at least one solvent is a solvent having a boiling point of 180° C. or lower, and it is more preferable that among the three solvents, at least one solvent is a solvent having a boiling point of 200° C. or higher and 300° C. or lower, and at least one solvent is a solvent having a boiling point of 180° C. or lower, from the viewpoint of film formability.

Examples of the coating method include coating methods, such as a spin coating method, a casting method, a microgravure coating method, a gravure coating method, a bar coating method, a roll coating method, a wire bar coating method, a dip coating method, a slit coating method, a capillary coating method, a spray coating method, and a nozzle coating method, and printing methods, such as a gravure printing method, a screen printing method, a flexographic printing method, an offset printing method, a reverse printing method, an ink jet printing method and the like. Because it is easy to do pattern formation or multicolor coating, printing methods, such as a gravure printing method, a screen printing method, a flexographic printing method, an offset printing method, a reverse printing method, an ink jet printing method and the like, are preferable.

Next, the organic thin film storing step will be described.

The organic thin film storing step of storing the formed organic thin film is normally performed subsequently to the organic thin film forming step. The organic thin film formed in the organic thin film forming step is stored in the organic thin film storing step. In the organic thin film storing step, the organic thin film is stored under an atmosphere where absolute humidity is kept at $2.0 \times 10^{-3}$ kg/kg (dry air) or more in terms of a weight. By doing so, light emission life of the organic EL device is extended. "Absolute humidity in terms of a weight" is expressed with addition of a unit "kg/kg (dry air)", and defined by "weight of water vapor entrained with 1 kg of dry air". In the following, "kg/kg (dry air)" is described as "kg/kg (DA)" in some cases.

Namely, the formed organic thin film is stored in an environment having humidity higher than that of dry air, and thereby accumulates moisture on the surface. Moisture accumulated on the surface of the organic thin film has an influence on interfacial quality between the organic thin film and a film formed thereon. When a very small amount of moisture is present at an interface between two films, specifically such an influence is conceivable that resistance between the films is slightly changed, leading to a change in amount of electric current, or the like.

For example, when an electrode is formed on the surface of the organic thin film, the electrode is slightly degraded by moisture present on the surface of the organic thin film. By causing the electrode to be slightly degraded before the organic EL device is driven, an abrupt decrease in amount of electric current is prevented even when the electrode is degraded after the organic EL device is driven, and resultantly light emission life of the organic EL device is extended.

From the viewpoint of life characteristics of the organic EL device, the organic thin film is stored preferably under an atmosphere where absolute humidity is kept at $2.0 \times 10^{-3}$ kg/kg (DA) or more and $2.0 \times 10^{-2}$ kg/kg (DA) or less in terms of a weight, more preferably under an atmosphere where absolute humidity is $5.0 \times 10^{-3}$ kg/kg (DA) or more and $2.0 \times 10^{-2}$ kg/kg (DA) or less in terms of a weight. From the viewpoint of suppression of generation of a non-light emitting part such as a dark spot or the like in the organic EL device, it is further preferable that the organic thin film is stored under an atmosphere where absolute humidity is kept at $5.0 \times 10^{-3}$ kg/kg (DA) or more and $1.5 \times 10^{-2}$ kg/kg (DA) or less in terms of a weight.

Preferably the organic thin film is stored normally at a temperature ranging from 0° C. to 50° C., preferably at a temperature ranging from 15° C. to 30° C. from the viewpoint of life characteristics of the organic EL device.

Storage time is appropriately selected according to the type of an organic compound contained in the organic thin film, and is normally about 1 minute to 2 hours. For moderately accumulating moisture on the surface of the organic thin film, appropriate storage time is 10 minutes to 1 hour, preferably 20 minutes to 40 minutes.

The organic thin film may be stored under an atmosphere containing an inert gas. Examples of the inert gas may include a helium gas, an argon gas, a nitrogen gas, a mixed gas thereof and the like. From the viewpoint of ease of preparing the device, the inert gas is preferably a nitrogen gas.

The organic thin film may be stored under an air atmosphere, or may be stored under an atmosphere where concentration of an inert gas in the atmosphere is equal to or more than concentration of an inert gas contained in the air atmosphere, as long as absolute humidity is kept at $2.0 \times 10^{-3}$ kg/kg (DA) or more in terms of a weight.

The organic thin film is stored preferably under an atmosphere having an oxygen concentration of 1000 ppm or less in terms of a volume, more preferably under an atmosphere having an oxygen concentration of 100 ppm or less in terms of a volume, further preferably under an atmosphere having an oxygen concentration of 10 ppm or less in terms of a volume, from the viewpoint of life characteristics of the organic EL device.

A method for forming an organic layer preferably includes a step of baking an organic thin film, which is performed subsequently to the organic thin film storing step. Baking of the organic thin film is performed for evaporating a part or all of the organic solvent used during formation of the organic thin film.

Baking of the organic thin film is performed preferably at a temperature ranging from 50° C. to 250° C., more preferably at a temperature ranging from 50° C. to 200° C., from the viewpoint of light emission characteristics and life characteristics of the organic EL device. Baking time is appropriately selected according to the type of an organic compound contained in the organic thin film, and is normally about 5 minutes to 2 hours. For moderately accumulating moisture on the surface of the organic thin film, baking temperature is 150° C. or lower, preferably 80 to 140° C., and baking time is 3 to 20 minutes, preferably 5 to 15 minutes.

From the viewpoint of life extension of the organic EL device, preferably baking of the organic thin film is performed under an atmosphere containing an inert gas. Examples of the inert gas may include a helium gas, an argon gas, a nitrogen gas, a mixed gas thereof and the like, and among them, a nitrogen gas is preferable because of ease of preparing the device. The above-mentioned inert gas is introduced into a storage device for storing an organic EL device precursor. Concentration of the inert gas in an atmosphere is normally 99% or more, preferably 99.5% or more in terms of a volume.

Preferably baking of the organic thin film is performed while concentrations of oxygen and moisture concentration in the atmosphere are each kept at 1000 ppm or less in terms of a volume. This baking removes a solvent contained in the organic thin film.

From the viewpoint of light emission characteristics and life characteristics of the organic EL device, baking of the organic thin film is performed preferably under an atmosphere where oxygen concentration and moisture concentration in the atmosphere are each kept at 600 ppm or less in terms of a volume, more preferably under an atmosphere where oxygen concentration and moisture concentration each are 300 ppm or less in terms of a volume, further preferably under an atmosphere where oxygen concentration and moisture concentration each are 100 ppm or less in terms of a volume, especially preferably under an atmosphere where oxygen concentration and moisture concentration each are 10 ppm or less in terms of a volume.

From the viewpoint of life extension of the organic EL device, preferably baking of the organic thin film is performed under a reduced-pressure atmosphere of 10 Pa or less. Preferably baking of the organic thin film is performed in a storage device into which an inert gas is introduced and the pressure of which is reduced. When baking is performed in a reduced-pressure atmosphere, a solvent contained in the organic thin film can be removed effectively as compared to baking at atmospheric pressure.

The organic thin film forming step and the organic thin film storing step are performed by passing a substrate sequentially through spaces of atmospheres suitable for the respective steps. Specifically, spaces for performing the steps may be divided as, for example, chambers, followed by appropriately controlling the atmosphere of each space. At this time, in the organic thin film forming step, moisture concentration in the atmosphere should be kept low, and the atmosphere for performing the organic thin film forming step is a low-humidity atmosphere having a moisture concentration of preferably 10 ppm or less, more preferably 5 ppm or less, further preferably 1 ppm or less in terms of a volume, from the viewpoint of improving device characteristics. In the organic thin film storing step, moisture concentration in the atmosphere should be kept high. The atmosphere for the organic thin film storing step is preferably an atmosphere where absolute humidity is kept at $2.0 \times 10^{-3}$ kg/kg (DA) or more and $2.0 \times 10^{-2}$ kg/kg (DA) or less in terms of a weight, more preferably an atmosphere where absolute humidity is $5.0 \times 10$ kg/kg (DA) or more and $2.0 \times 10^{-2}$ kg/kg (DA) or less in terms of a weight. From the viewpoint of suppression of generation of a non-light emitting part such as a dark spot or the like in the organic EL device, an atmosphere where absolute humidity is kept at $5.0 \times 10^{-3}$ kg/kg (DA) or more and $1.5 \times 10^{-2}$ kg/kg (DA) or less in terms of a weight is further preferable. Thus, it is necessary that a space be divided, and an atmosphere be controlled so that a moisture atmosphere of a chamber for performing the organic thin film storing step does not flow into a chamber for performing the organic thin film forming step to adversely affect formation of the organic thin film when a substrate passes through a boundary between divided spaces.

Figure 3A:
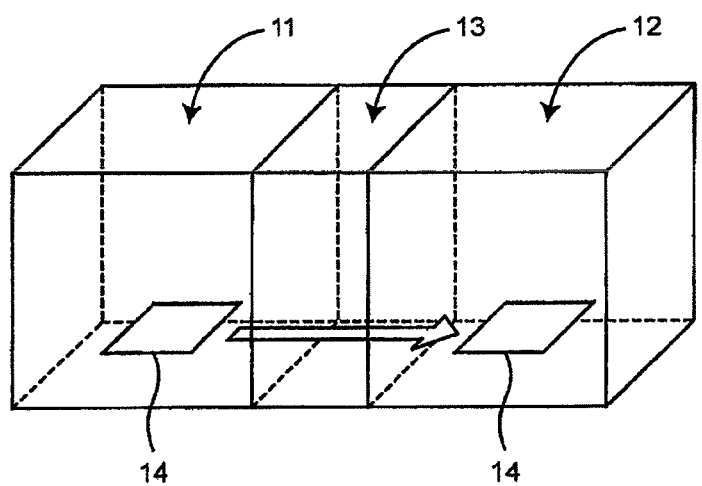
FIGS. 3A and 3B are schematic views showing an example of divisions of a space for performing an organic thin film forming step and a space for performing an organic thin film storing step.

FIG. 3 is a schematic view showing an example of divisions of a space for performing an organic thin film forming step and a space for performing an organic thin film storing step. In the example in FIG. 3(a), a buffer space 13 is provided between a space 11 for performing the organic thin film forming step and a space 12 for performing the organic thin film storing step. A substrate 14 passes through the space 11 for performing the organic thin film forming step, the buffer space 13 and the space 12 for performing the organic thin film storing step in this order.

In this case, in the case where atmospheric pressure of the space 11 for performing the organic thin film forming step is atmospheric pressure A, atmospheric pressure of the space 12 for performing the organic thin film storing step is atmospheric pressure B, and atmospheric pressure of the buffer space 13 is atmospheric pressure C, it should become that atmospheric pressure A>atmospheric pressure C and that atmospheric pressure B>atmospheric pressure C, i.e. atmospheric pressure of the buffer space is negative pressure as compared to those of the spaces for performing the organic thin film forming step and the organic thin film storing step.

In this way, the atmosphere for the organic thin film storing step is inhibited from flowing into the space for performing the organic thin film forming step, so that a preferred atmosphere of the present invention is achieved. The atmosphere of the buffer space may be similar to that of the space for performing the organic thin film forming step except that the atmospheric pressure is negative pressure.

Figure 3B:
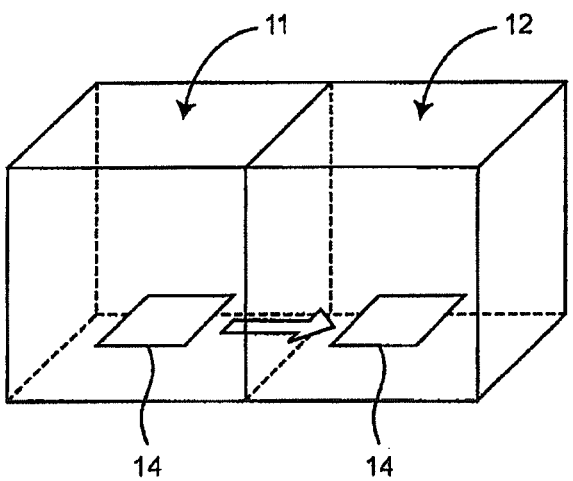

In the example in FIG. 3(b), the space 11 for performing the organic thin film forming step and the space 12 for performing the organic thin film storing step are adjacent to each other. A substrate 14 passes through the space 11 for performing the organic thin film forming step and the space 12 for performing the organic thin film storing step in this order.

In this case, in the case where atmospheric pressure of the space for performing the organic thin film forming step is atmospheric pressure A, and atmospheric pressure of the space for performing the organic thin film storing step is atmospheric pressure B, it should become that atmospheric pressure A>atmospheric pressure B, i.e. atmospheric pressure of the space for the organic thin film forming step is positive pressure as compared to that of the space for the organic thin film storing step. In this way, the atmosphere for the organic thin film storing step is inhibited from flowing into the atmosphere for the organic thin film forming step, so that a preferred atmosphere of the present invention is achieved.

(Organic Compound)

Next, an organic compound contained in the organic layer 6 will be described. The organic compound is solid at 1 atm and at 25° C. When the organic layer 6 is a light emitting layer, the organic compound is preferably a light emitting organic compound which emits principally fluorescent light and/or phosphorescent light, or a dopant which helps a light emitting organic compound, the organic compound being more preferably a phosphorescent light emitting compound. The dopant is added, for example, for improving light emission efficiency or changing light emission wavelength. The organic compound may be a low molecular weight compound or a polymer compound as long as a film can be formed by coating, but a polymer compound having a number average molecular weight of $10^3$ to $10^8$ in terms of polystyrene is preferable. When a light emitting layer is formed using as a light emitting organic compound a light emitting polymer compound which emits phosphorescent light (phosphorescent light emitting polymer compound), or a light emitting layer is formed using as a light emitting organic compound a light emitting organic compound which emits phosphorescent light (phosphorescent light emitting organic compound) and using a composition of a polymer compound and the light emitting organic compound which emits phosphorescent light (phosphorescent light emitting composition), an effect of extending light emission life of the organic EL device is particularly improved.

When the method of the present invention is used, an effect of extending light emission life of the organic EL device is improved because an abrupt change in resistance during driving can be suppressed by slightly changing resistance between the surface of an organic thin film and a film formed on the surface before driving. For example, a fluorescent light emitting material has large current density of a driving current, and therefore even when resistance between the surface of an organic thin film and a film formed on the surface is slightly changed before driving, an influence on suppression of an abrupt change in resistance during driving is small. On the other hand, a phosphorescent light emitting material has small current density of a driving current, and therefore an influence on suppression of an abrupt change in resistance during driving by a change in resistance between the surface of an organic thin film and a film formed on the surface before driving is large. That is, for the phosphorescent light emitting material, performance of the device is relatively significantly influenced.

Examples of the low molecular weight compound which is preferable as a light emitting organic compound include distyrylarylene derivatives, oxadiazole derivatives, carbazole derivatives such as 4,4'-bis(carbazolyl-9-yl)biphenyl (CBP), and the like.

Examples of the polymer compound which is preferable as a light emitting organic compound may include polyparaphenylene vinylene derivatives, polythiophene derivatives, polyparaphenylene derivatives, polysilane derivatives, polyacetylene derivatives, polyfluorene derivatives, polyvinylcarbazole derivatives, compounds obtained by increasing molecular weight of a dye type dopant material and a metal complex type dopant material as shown below as an example, and the like.

Examples of the phosphorescent light emitting organic compound include metal complexes having a light emission from a triplet excited state, such as an iridium complex, a platinum complex and the like.

Among the above-mentioned light-emitting organic compounds, examples of the compound which emits blue light may include distyrylarylene derivatives, oxadiazole derivatives, polymers thereof, polyvinylcarbazole derivatives, polyparaphenylene derivatives, polyfluorene derivatives and the like. Particularly, polyvinylcarbazole derivatives, polyparaphenylene derivatives, and polyfluorene derivatives, each of which is a polymer compound, are preferable.

Examples of the compound which emits green light may include quinacridone derivatives, coumarin derivatives, polymers thereof, polyparaphenylene vinylene derivatives, polyfluorene derivatives and the like. Particularly, polyparaphenylene vinylene derivatives and polyfluorene derivatives, each of which is a polymer compound, are preferable.

Examples of the compound which emits red light may include coumarin derivatives, thiophene ring compounds, polymers thereof, polyparaphenylene vinylene derivatives, polythiophene derivatives, polyfluorene derivatives and the like. Particularly, polyparaphenylene vinylene derivatives, polythiophene derivatives and polyfluorene derivatives, each of which is a polymer compound, are preferable.

(Dopant Material)

Examples of the dye type dopant material may include cyclopendamine derivatives, tetraphenylbutadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, trifumanylamine derivatives, oxadiazole dimers, pyrazoline dimers, quinacridone derivatives, coumarin derivatives, rubrene derivatives, squarylium derivatives, porphyrin derivatives, tetracene derivatives, pyrazolone derivatives, decacyclene and phenoxazone.

Examples of the metal complex type dopant material may include metal complexes having Al, Zn, Be or the like or a rare earth metal such as Tb, Eu, Dy or the like as a center metal and having oxadiazole, a triadiazole structure, a phenylpyridine structure, a phenylbenzimidazol structure, a quinoline structure or the like as a ligand. Examples of the metal complex may include an aluminum-quinolinol complex, a benzoquinolinol-beryllium complex, a benzoxazolyl-zinc complex, a benzothiazole-zinc complex, an azomethyl-zinc complex, a porphyrin-zinc complex and a europium complex.

After the organic layer 6 is formed, the second electrode 7 is formed on the organic layer 6 to produce the organic EL device 1.

Figure 2:
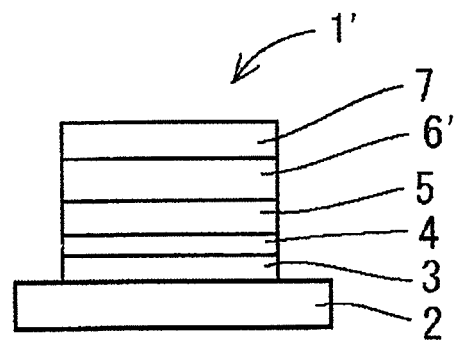
FIG. 2 is a view showing a structure of another aspect of an organic EL device.

FIG. 2 is a view schematically showing another embodiment of an organic EL device produced by a method of the present invention. The organic EL device 1' includes a first electrode 3, a second electrode 7 and a first organic layer 4, a second organic layer 5 and a third organic layer 6' each provided between the first electrode and the second electrode. The organic layers 4, 5 and 6' each contain an organic compound.

For typical functions of the layers that form the organic EL device 1', the first electrode 3 is an anode, the second electrode 7 is a cathode, the first organic layer 4 is a hole injection layer, the second organic layer 5 is a hole transport layer, and the third organic layer 6' is a light emitting layer.

A step of forming the aforementioned organic layers will be described below using as an example the organic EL device shown in FIG. 2, and details of other constitutional components of the organic EL device will be described later.

When the organic layer 6' is a light emitting layer, the organic layer 6' is formed by a method similar to that for the organic layer 6 in the aforementioned organic EL device 1.

In this case, the organic layers 4 and 5 are adjacent to the light emitting layer, and correspond to layers which are not directly involved in light emission, and have a function of injection or transport of charges, such as a hole injection layer, a hole transport layer, an electron injection layer, an electron transport layer and the like.

When the first electrode 3 is an anode, examples of the functional layer corresponding to the organic layers 4 and 5 include a hole injection layer, a hole transport layer and the like. Even not shown, the organic EL device 1' may have functional layers such as an electron injection layer, an electron transport layer and the like between the third organic layer 6' as a light emitting layer and the second electrode 7.

A method for forming a functional layer which is not directly involved in light emission will be described below.

Formation of the functional layer containing an organic compound may be performed in the same manner as heretofore, and is preferably performed using a coating method in which a production process is simple, and the area of a device is easily increased. For example, the functional layer is formed by applying a solution containing an organic compound onto a layer on which the functional layer is formed, and then drying a solvent contained in an organic thin film.

When a coating method is used for formation of the functional layer, the organic compound is preferably a polymer compound from the viewpoint of coatability. For the solvent and coating method when the organic thin film is formed by a solution coating method, they can be employed a solvent and a coating method similar to the solvent and coating method used when the organic thin film containing an organic compound is formed as in the foregoing formation of the organic layer 6.

Preferably the thin film containing an organic compound is formed under atmospheric pressure in an atmosphere containing an inert gas because the organic EL device can be easily produced. Examples of the inert gas may include a helium gas, an argon gas, a nitrogen gas, a mixed gas thereof and the like, and among them, a nitrogen gas is preferable from the viewpoint of ease of preparing the device.

The thin film may be formed under an air atmosphere, or may be formed under an atmosphere where concentration of an inert gas in the atmosphere is 99% or more in terms of a volume. From the viewpoint of extending device life of the organic EL device, the thin film is formed preferably under an atmosphere where concentration of an inert gas is 99.5% or more.

From the viewpoint of ease of preparing the device, the thin film is formed preferably under an atmosphere having an oxygen concentration of 1000 ppm or less in terms of a volume and/or a moisture concentration of 1000 ppm or less in terms of a volume, more preferably under an atmosphere having an oxygen concentration of 10 ppm or less in terms of a volume and/or a moisture concentration of 10 ppm or less in terms of a volume.

Preferably, next, the thin film is baked while concentration of oxygen and concentration of moisture in the atmosphere are each kept at 1000 ppm or less in terms of a volume. This baking removes a solvent contained in the thin film.

Baking of the thin film is performed preferably at a temperature ranging from 50° C. to 250° C., more preferably at a temperature ranging from 50° C. to 200° C., from the viewpoint of light emission characteristics and life characteristics of the organic EL device. Baking time is appropriately selected according to an organic compound contained in the thin film, and is normally about 5 minutes to 2 hours.

From the viewpoint of life extension of the organic EL device, preferably baking of the thin film is performed under an atmosphere containing an inert gas or under an atmosphere of 10 Pa or less. Examples of the inert gas may include a helium gas, an argon gas, a nitrogen gas, a mixed gas thereof and the like, and among them, a nitrogen gas is preferable from the viewpoint of ease of preparing the device.

From the viewpoint of light emission characteristics and life characteristics of the organic EL device, formation of the thin film and baking of the thin film are performed preferably under an atmosphere where oxygen concentration and moisture concentration in the atmosphere are each kept at 600 ppm or less in terms of a volume, more preferably under an atmosphere where oxygen concentration and moisture concentration each are 300 ppm or less in terms of a volume, further preferably under an atmosphere where oxygen concentration and moisture concentration each are 100 ppm or less in terms of a volume, especially preferably under an atmosphere where oxygen concentration and moisture concentration each are 10 ppm or less in terms of a volume.

For example, a step of forming the first organic layer 4 and the second organic layer 5 on the first electrode 3 and forming on the second organic layer 5 a thin film containing an organic compound contained in the organic layer 6, a thin film storing step and a baking step are performed to form a light emitting layer which is the organic layer 6', and the second electrode 7 is further formed thereon to produce the organic EL device 1'.

The device configuration and constitutional components of the organic EL device will be described further in detail below.

The organic EL device of the present invention includes as essential constitutional components a first electrode, a second electrode and an organic layer arranged between the first electrode and the second electrode. When the organic layer is a light emitting layer, a layer may be further provided between the first electrode (e.g. an anode) and the second electrode (e.g. a cathode) in addition to the aforementioned light emitting layer, for example, for improving device characteristics.

The layer includes a functional layer to be provided adjacent to the light emitting layer.

Examples of the layer to be provided between the cathode and the light emitting layer include an electron injection layer, an electron transport layer, a hole blocking layer and the like. When both the electron injection layer and the electron transport layer are provided between the cathode and the light emitting layer, the layer that is in contact with the cathode may be called an electron injection layer, and the layer other than this electron injection layer may be called an electron transport layer.

The electron injection layer is a layer that has a function to improve electron injection efficiency from a cathode. The electron transport layer is a layer that has a function to improve electron injection from a cathode, an electron injection layer, or an electron transport layer that is closer to the cathode. The hole blocking layer is a layer that has a function to block transportation of holes. When the electron injection layer and/or the electron transport layer has a function to block transportation of holes, these layers may also serve as a hole blocking layer.

It can be confirmed that a hole blocking layer has a function to block transportation of holes by, for example, preparing a device which allows only a hole current to pass. For example, by preparing a device which does not include a hole blocking layer and allows only a hole current to pass and a device having a configuration in which a hole blocking layer is inserted in the above-mentioned device, and observing a decrease in current value of the device including a hole blocking layer, it can be confirmed that the hole blocking layer shows a function to block transportation of holes.

Examples of the layer to be provided between the anode and the light emitting layer include a hole injection layer, a hole transport layer, an electron blocking layer and the like. When both a hole injection layer and a hole transport layer are provided between the anode and the light emitting layer, the layer that is in contact with the anode may be called a hole injection layer, and the layer other than this hole injection layer may be called a hole transport layer.

The hole injection layer is a layer that has a function to improve hole injection efficiency from an anode. The hole transport layer is a layer that has a function to improve hole injection from an anode, a hole injection layer, or a hole transport layer that is closer to the anode. The electron blocking layer is a layer that has a function to block transportation of electrons. When the hole injection layer and/or the hole transport layer has a function to block transportation of electrons, these layers may also serve as an electron blocking layer.

It can be confirmed that an electron blocking layer has a function to block transportation of electrons by, for example, preparing a device which allows only an electron current to pass. For example, by preparing a device which does not include an electron blocking layer and allows only an electron current to pass and a device having a configuration in which an electron blocking layer is inserted in the above-mentioned device, and observing a decrease in current value of the device including an electron blocking layer, it can be confirmed that the electron blocking layer shows a function to block transportation of electrons.

The organic layer of the present invention should contain an organic compound, and may be any of a light emitting layer, a hole injection layer, a hole transport layer, an electron blocking layer, an electron injection layer, an electron transport layer and a hole blocking layer. Particularly, the organic layer is preferably a light emitting layer.

Examples of the device configuration that the organic EL device of the present embodiment can have are shown below:
a) anode/hole injection layer/light emitting layer/cathode
b) anode/hole injection layer/light emitting layer/electron injection layer/cathode
c) anode/hole injection layer/light emitting layer/electron transport layer/cathode
e) anode/hole injection layer/light emitting layer/electron transport layer/electron injection layer/cathode
f) anode/hole transport layer/light emitting layer/cathode
d) anode/hole transport layer/light emitting layer/electron injection layer/cathode
e) anode/hole transport layer/light emitting layer/electron transport layer/cathode
f) anode/hole transport layer/light emitting layer/electron transport layer/electron injection layer/cathode
g) anode/hole injection layer/hole transport layer/light emitting layer/cathode
h) anode/hole injection layer/hole transport layer/light emitting layer/electron injection layer/cathode
i) anode/hole injection layer/hole transport layer/light emitting layer/electron transport layer/cathode
j) anode/hole injection layer/hole transport layer/light emitting layer/electron transport layer/electron injection layer/cathode
k) anode/light emitting layer/electron injection layer/cathode
l) anode/light emitting layer/electron transport layer/cathode
m) anode/light emitting layer/electron transport layer/electron injection layer/cathode
wherein the sign "/" means that the layers sandwiching the sign "/" are laminated adjacent to each other, and the same applies hereinafter.

The organic EL device may have two or more light emitting layers. When layers provided between the anode and the cathode each are a "repeating unit A" in the configurations shown in a) to m), the organic EL device having two light emitting layers may have the device configuration shown in the following n).
n) anode/(repeating unit A)/charge generation layer/(repeating unit A)/cathode When the "(repeating unit A)/charge generation layer" is a "repeating unit B", specifically the organic EL device having three or more light emitting layers may have the device configuration shown in the following o).
o) anode/(repeating unit B)x/(repeating unit A)/cathode Here, the sign "x" represents an integer of 2 or more, and the "(repeating unit B)x" represents a configuration in which "x" (repeating units B) are stacked. The charge generation layer is a layer in which a hole and an electron are generated by applying an electric field. Examples of the charge generation layer may include thin films made of vanadium oxide, and indium tin oxide (Indium Tin Oxide: abbreviated as ITO), molybdenum oxide.

The organic EL device may be covered with a sealing member such as a sealing film, a sealing plate or the like for sealing. When the organic EL device is provided on a substrate, normally an anode is disposed on the substrate side, but a cathode may be disposed on the substrate side.

In the organic EL device of the present embodiment, normally all layers disposed on a side where light is taken out, with respect to the light emitting layer, are transparent in order to take out internally generated light to outside. For the degree of transparency, a visible light transmittance between the outermost surface of the organic EL device on the side where light is taken out and the light emitting layer is preferably 40% or more. In the case of an organic EL device which is required to emit light in an ultraviolet region or an infrared region, an organic EL device that shows a light transmittance of 40% or more in the region is preferable.

In the organic EL device of the present embodiment, an insulating layer having a thickness of 2 nm or less may be provided adjacent to an electrode in order to improve adhesiveness to the electrode or improve charge injection performance from the electrode. For improving adhesiveness or preventing mixing at an interface, a thin buffer layer may be inserted between the aforementioned layers.

The order of layers to be laminated, the number of layers and thickness of each layer can be appropriately determined by taking into light emission efficiency and device life into consideration.

Next, a material of each layer that forms the organic EL device, and a method for formation thereof will be more specifically described.

<Substrate>

A substrate which is not chemically changed in steps for producing an organic EL device is suitably used, and for example, glass, plastics, polymer films, silicon substrates, laminates thereof and the like are used. As the aforementioned substrate, a commercially available product can be used, or the substrate can be produced by a known method.

<Anode>

In the case of an organic EL device having a configuration in which light is taken out from a light emitting layer through an anode, a transparent or translucent electrode is used as an anode. As the transparent electrode or translucent electrode, thin films of metal oxides, metal sulfides, metals and the like, which have high electrical conductivity, can be used, and those having high light transmittance are suitably used. Specifically, thin films composed of indium oxide, zinc oxide, tin oxide, ITO, indium zinc oxide (Indium Zinc Oxide: abbreviated as IZO), gold, platinum, silver, copper and the like are used, and among them, a thin film composed of ITO, IZO or tin oxide is suitably used. Examples of the method for preparing an anode may include a vacuum deposition method, a sputtering method, an ion plating method, a plating method and the like. An organic transparent electrically conductive film of polyaniline or a derivative thereof, polythiophene or a derivative thereof, or the like may also be used as the anode.

For the anode, a material that reflects light may also be used, and metals, metal oxides and metal sulfides that have a work function of 3.0 eV or more are preferable as the material.

Thickness of the anode appropriately can be determined by taking light permeability and electrical conductivity into consideration, and is, for example, 10 nm to 10 preferably 20 nm to 1 μm, more preferably 40 nm to 500 nm.

<Hole Injection Layer>

Examples of the hole injection material that forms the hole injection layer may include oxides such as vanadium oxide, molybdenum oxide, ruthenium oxide, aluminum oxide and the like, phenylamine-based compounds, starburst-type amine-based compounds, phthalocyanine-based compounds, amorphous carbon, polyaniline, polythiophene derivatives and the like.

Examples of the method for forming a hole injection layer include a method in which a thin film containing a hole injection material is formed, and then baked or dried.

Examples of the method for forming a thin film containing a hole injection material may include film formation from a solution containing a hole injection material, and from the viewpoint of life extension, it is preferable to perform film formation in an atmosphere similar to that in the aforementioned organic layer forming step. The solvent used for film formation from a solution is not particularly limited as long as it is a solvent that dissolves a hole injection material, examples thereof may include chlorine-based solvents such as chloroform, methylene chloride, dichloroethane and the like; ether-based solvents such as tetrahydrofuran and the like; aromatic hydrocarbon-based solvents such as toluene, xylene, anisole, tetralin, phenylcyclohexane and the like; ketone-based solvents such as acetone, methyl ethyl ketone and the like; ester-based solvents such as ethyl acetate, butyl acetate, ethyl cellosolve acetate and the like; alcohol-based solvents such as isopropyl alcohol and the like; and water, and a mixture thereof may be used.

Examples of the method for film formation from a solution may include coating methods such as a spin coating method, a casting method, a nozzle coating method, a microgravure coating method, a gravure coating method, a bar coating method, a roll coating method, a wire bar coating method, a dip coating method, a spray coating method, a screen printing method, a flexographic printing method, an offset printing method, an ink jet printing method and the like.

Thickness of the hole injection layer, the optimal value of which varies depending on the material to be used, is appropriately determined so that a driving voltage and light-emitting efficiency will be moderate values, at least such thickness is required that a pinhole is not formed, and too large thickness is not preferable because the driving voltage of the device is increased. Therefore, thickness of the hole injection layer is, for example, 1 nm to 1 μm, preferably 2 nm to 500 nm, more preferably 5 nm to 200 nm.

<Hole Transport Layer>

Examples of the hole transport material that forms a hole transport layer include polyvinylcarbazole or derivatives thereof, polysilane or derivatives thereof, polysiloxane derivatives having an aromatic amine residue in the side chain or main chain, pyrazoline derivatives, arylamine derivatives, stilbene derivatives, triphenyldiamine derivatives, polyaniline or derivatives thereof, polythiophene or derivatives thereof, polyarylamine or derivatives thereof, polypyrrole or derivatives thereof, polyp-phenylenevinylene) or derivatives thereof, poly(2,5-thienylenevinylene) or derivatives thereof, polyfluorene derivatives, polymer compounds having an aromatic amine residue and the like.

Among them, as the hole transport material, polyvinylcarbazole or derivatives thereof, polysilane or derivatives thereof, polysiloxane derivatives having an aromatic amine residue in the side chain or main chain, polyaniline or derivatives thereof, polythiophene or derivatives thereof, polyarylamine or derivatives thereof, poly(p-phenylenevinylene) or derivatives thereof, poly(2,5-thienylenevinylene) or derivatives thereof, polyfluorene derivatives, and polymer compounds having an aromatic amine residue are preferable, and polyvinylcarbazole or derivatives thereof, polyfluorene derivatives, and polymer compounds having an aromatic amine residue are further preferable. In the case of a low molecular weight hole transport material, it is preferable to use the material while being dispersed in a polymer binder.

When the functional layer in the present invention is a hole transport layer, examples of the method for forming a hole transport layer include a method similar to the method for forming the organic layer 6 included in the organic EL device 1.

When the hole transport layer is not a functional layer, examples of the method for forming a hole transport layer include a method in which a thin film containing a hole transport material is formed, and then baked or dried.

The method for forming a thin film containing a hole transport material is not particularly limited, and examples thereof may include film formation from a mixed liquid containing a polymer binder and a hole transport material in the case of a low molecular weight hole transport material, and film formation from a solution containing a hole transport material in the case of a polymer hole transport material.

Examples of the solvent that is used for film formation from a solution include a solvent similar to the solvent which is used when a thin film containing an organic compound is formed as in the foregoing formation of the organic layer 6.

Examples of the method for film formation from a solution may include a coating method similar to the coating method as in the foregoing formation of the organic layer 6, and from the viewpoint of life extension, it is preferable to perform film formation in an atmosphere similar to that in the aforementioned functional layer forming step.

As the polymeric binder to be mixed, those that do not extremely hinder charge transport are preferable, those that exhibit weak absorption to visible light are suitably used, and examples thereof may include polycarbonate, polyacrylate, polymethyl acrylate, polymethyl methacrylate, polystyrene, polyvinyl chloride, polysiloxane and the like.

Thickness of the hole transport layer, the optimal value of which varies depending on the material to be used, is appropriately determined so that a driving voltage and light-emitting efficiency will be moderate values, at least such thickness is required that a pinhole is not formed, and too large thickness is not preferable because the driving voltage of the device is increased. Therefore, thickness of the hole transport layer is, for example, 1 nm to 1 μm, preferably 2 nm to 500 nm, more preferably 5 nm to 200 nm.

<Light Emitting Layer>

Examples of the organic compound contained in the light emitting layer include the aforementioned light emitting organic compound, dopant which helps a light emitting organic compound, and the like.

<Electron Transport Layer>

Known materials can be used as an electron transport material that forms the electron transport layer, and examples thereof include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, or 8-hydroxyquinoline or metal complexes of derivatives thereof, polyquinone or derivatives thereof, polyquinoxaline or derivatives thereof, polyfluorene or its derivative, and the like.

Among them, as the electron transport material, oxadiazole derivatives, benzoquinone or derivatives thereof, anthraquinone or derivatives thereof, or 8-hydroxyquinoline or metal complexes of derivatives thereof, polyquinoline or derivatives thereof, polyquinoxaline or derivatives thereof, and polyfluorene or derivatives thereof are preferable, and 2-(4-biphenylyl)-5-(4-tert-butylphenyl)-1,3,4-oxadiazole, benzoquinone, anthraquinone, tris(8-quinolinol)aluminum and polyquinoline are further preferable.

When the functional layer in the present invention is an electron transport layer, examples of the method for forming an electron transport layer include a method similar to the method for forming the hole transport layer 5 included in the organic EL device 1'.

When the electron transport layer is not a functional layer, examples of the method for forming an electron transport layer include a method in which a thin film containing an electron transport material is formed, and then baked or dried.

The method for forming a thin film containing an electron transport material is not particularly limited, and examples thereof may include a vacuum vapor deposition method from a powder or film formation from a solution or a molten state in the case of a low molecular weight electron transport material, and film formation from a solution or a molten state in the case of a polymer electron transport material. When a film is formed from a solution or a molten state, a polymeric binder may be used together. Examples of the method for forming an electron transport layer from a solution may include a film formation method similar to the foregoing method for forming a hole transport layer from a solution.

Thickness of the electron transport layer, the optimal value of which varies depending on the material to be used, is appropriately determined so that a driving voltage and light-emitting efficiency will be moderate values, at least such thickness is required that a pinhole is not formed, and too large thickness is not preferable because the driving voltage of the device is increased. Therefore, thickness of the electron transport layer is, for example, 1 nm to 1 μm, preferably 2 nm to 500 nm, more preferably 5 nm to 200 nm.

<Electron Injection Layer>

As a material that forms the electron injection layer, an optimum material is appropriately selected according to the type of the light emitting layer, and examples thereof may include alkali metals, alkali earth metals, alloys containing one or more of alkali metals or alkali earth metals, and oxides, halides and carbonates of alkali metals or alkali earth metals, mixtures of these substances, and the like. Examples of the alkali metal and the oxide, halide and carbonate of the alkali metal may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, lithium carbonate and the like. Examples of the alkali earth metal and the oxide, halide and carbonate of the alkali earth metal may include magnesium, calcium, barium, strontium, magnesium oxide, magnesium fluoride, calcium oxide, calcium fluoride, barium oxide, barium fluoride, strontium oxide, strontium fluoride, magnesium carbonate and the like. The electron injection layer may be composed of a laminate formed by laminating two or more layers, and mention may be made of, for example, LiF/Ca and the like. The electron injection layer is formed by a vacuum deposition method, a sputtering method, a printing method or the like.

Thickness of the electron injection layer is preferably about 1 nm to 1 μm.

<Cathode>

The material of the cathode is preferably a material which has a small work function, makes it easy to inject electrons into a light emitting layer, and has high electrical conductivity. In an organic EL device in which light is taken out from the anode side, light from the light emitting layer is reflected at the cathode to the anode side, and therefore the material of the cathode is preferably a material having a high visible light reflectance. For the cathode, for example, an alkali metal, an alkali earth metal, a transition metal, a Group III-B metal and the like can be used. As the material of the cathode, a metal such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium or the like, an alloy of two or more of the foregoing metals, an alloy of one or more of the foregoing metals and one or more selected from gold, silver, platinum, copper, manganese, titanium, cobalt, nickel, tungsten and tin, or graphite or a graphite intercalation compound, or the like is used. Examples of the alloys may include magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. As the cathode, an electrically conductive transparent electrode composed of an electrically conductive metal oxide, an electrically conductive organic substance or the like can be used. Specifically, examples of the electrically conductive metal oxide may include indium oxide, zinc oxide, tin oxide, ITO and IZO, and examples of the electrically conductive organic substance include polyaniline or derivatives thereof, polythiophene or derivatives thereof, and the like. The cathode may be composed of a laminate formed by laminating two or more layers.

Thickness of the cathode is appropriately determined by taking electrical conductivity and durability into consideration, and is, for example, 10 nm to 10 μm, preferably 20 nm to 1 μm, further preferably 50 nm to 500 nm.

Examples of the method for preparing the cathode may include a vacuum vapor deposition method, a sputtering method, a laminating method in which a metal thin film is bonded by thermocompression, and the like.

<Insulating Layer>

Examples of the material of the insulating layer may include metal fluorides, metal oxides, organic insulating materials and the like. Examples of the organic EL device in which an insulating layer having a thickness of 2 nm or less is provided may include those in which an insulating layer having a thickness of 2 nm or less is provided adjacent to a cathode, and those in which an insulating layer having a thickness of 2 nm or less is provided adjacent to an anode.

The organic EL device described above can be suitably used for planar light sources that are used as light sources of curved or flat lighting devices, for example scanners, and for display devices.

Examples of the display device including an organic EL device may include active matrix display devices, passive matrix display devices, segment display devices, dot matrix display devices, liquid crystal display devices and the like. The organic EL device is used as a light emitting device for forming pixels in an active matrix display device and a passive matrix display device, used as a light emitting device for forming segments in a segment display device, and used as a backlight in a dot matrix display device and a liquid crystal display device.

EXAMPLES

The present invention will be described further in detail below by way of Examples, but the present invention is not limited to Examples below.

In Examples, number average molecular weight (Mn) in terms of polystyrene and weight average molecular weight (Mw) in terms of polystyrene were determined using a GPC (manufactured by Shimadzu Corporation; trade name: LC-10Avp). A polymer compound to be measured was dissolved in tetrahydrofuran so as to have a concentration of about 0.5% by weight, and 30 μL of the solution was injected into the GPC. For a mobile phase of the GPC, tetrahydrofuran was used, and made to flow at a flow rate 0.6 mL/minute. For a column, two pieces of "TSKgel Super HM-H (manufactured by TOSOH CORPORATION)" and one piece of "TSKgel Super H2000 (manufactured by TOSOH CORPORATION)" were connected in series. For a detector, a differential refractive index detector (manufactured by Shimadzu Corporation; trade name: RID-10A) was used.

Example 1

An organic EL device was prepared by the following method.

To a glass substrate on which an ITO film (anode) having a thickness of 150 nm was formed by a sputtering method, a suspension liquid of poly(3,4)ethylenedioxythiophene/polystyrenesulfonic acid ("Baytron P" manufactured by Starck, Inc.) was applied by a spin coating method to form a thin film having a thickness of 65 nm, and heating was performed on a hot plate at 200° C. for 10 minutes to bake the thin film, thereby obtaining a hole injection layer. In formation of the hole injection layer, steps of forming and baking the thin film were performed in an air atmosphere.

Next, a polymer compound 1 as a hole transport material was dissolved in xylene to prepare a xylene solution 1. Concentration of the polymer compound 1 in the xylene solution 1 was 0.8% by weight. Next, in a nitrogen atmosphere where oxygen concentration and moisture concentration each controlled to 10 ppm or less in terms of a volume, the xylene solution 1 was applied onto the hole injection layer by a spin coating method to form a thin film for a hole transport layer, which had a thickness of 20 nm, and in a nitrogen atmosphere where oxygen concentration and moisture concentration each controlled to 10 ppm or less in terms of a volume, heating was performed at 180° C. for 1 hour to bake the thin film, thereby obtaining a hole transport layer.

Next, a 1.3 wt % xylene solution A of a phosphorescent light emitting composition formed by adding a phosphorescent light emitting organic compound 1 to a polymer compound 2 in a ratio of 7.5% by weight was prepared. Next, in a nitrogen atmosphere where oxygen concentration and moisture concentration were each controlled to 10 ppm or less in terms of a volume, the xylene solution A was applied onto the hole transport layer by a spin coating method to form a thin film for a light emitting layer, which had a thickness of 80 nm. Further, in moist nitrogen controlled to have an oxygen concentration of 10 ppm or less in terms of a volume and an absolute humidity of $1.3 \times 10^{-2}$ kg/kg (DA) in terms of a weight, the thin film was stored for 30 minutes to form an organic layer. Storage of the organic thin film was performed at room temperature (25° C.).

Further, in a nitrogen atmosphere where oxygen concentration and moisture concentration were each controlled to 10 ppm or less in terms of a volume, the organic layer was baked at 130° C. for 10 minutes. Baking of the organic layer was performed in an atmosphere of atmospheric pressure. The organic layer functions as a light emitting layer. In formation of the hole transport layer and the light emitting layer, pressure in steps of forming and baking the thin film was atmospheric pressure.

Next, pressure was reduced to $1.0 \times 10^{-4}$ Pa or less, barium was then deposited in a thickness of about 5 nm as a cathode, and aluminum was then deposited in a thickness of about 80 nm. After deposition, sealing was performed using a glass substrate to prepare an organic EL device.

The prepared organic EL device emitted red light (CIE1931: (0.62, 0.38), and when constant current driving was performed at an initial luminance of 12000 cd/m$^2$, time until luminance became 75% of initial luminance (luminance 75% life) was 67.1 hours.

Example 2

An organic EL device was prepared by the same method as that in Example 1 except that in formation of an organic layer, a thin film was stored in moist nitrogen controlled to have an oxygen concentration of 10 ppm or less in terms of a volume and an absolute humidity of $7.7 \times 10^{-3}$ kg/kg (DA).

The prepared organic EL device emitted red light (CIE1931: (0.62, 0.38), and when constant current driving was performed at an initial luminance of 12000 cd/m$^2$, time until luminance became 75% of initial luminance (luminance 75% life) was 62.0 hours.

Comparative Example 1

An organic EL device was prepared by the same method as that in Example 1 except that storage of a thin film in moist nitrogen was not performed.

The prepared organic EL device emitted red light (CIE1931: (0.62, 0.38), and when constant current driving was performed at an initial luminance of 12000 cd/m$^2$, time until luminance became 75% of initial luminance (luminance 75% life) was 47.9 hours.

Example 3

An organic EL device was prepared by the following method.

To a glass substrate on which an ITO film (anode) having a thickness of 150 nm was formed by a sputtering method, a suspension liquid of poly(3,4)ethylenedioxythiophene/polystyrenesulfonic acid ("Baytron P" manufactured by Starck, Inc.) was applied by a spin coating method to form a thin film having a thickness of 65 nm, and heating was performed on a hot plate at 200° C. for 10 minutes to bake the thin film, thereby obtaining a hole injection layer. In formation of the hole injection layer, steps of forming and baking the thin film were performed in an air atmosphere.

Next, a polymer compound 1 as a hole transport material was dissolved in xylene to prepare a xylene solution 1. Concentration of the polymer compound 1 in the xylene solution 1 was 0.8% by weight. Next, in a nitrogen atmosphere where oxygen concentration and moisture concentration were each controlled to 10 ppm or less in terms of a volume, the xylene solution 1 was applied onto the hole injection layer by a spin coating method to form a thin film for a hole transport layer, which had a thickness of 20 nm, and in a nitrogen atmosphere where oxygen concentration and moisture concentration were each controlled to 10 ppm or less in terms of a volume, heating was performed at 180° C. for 1 hour to bake the thin film, thereby obtaining a hole transport layer.

Next, a 1.4 wt % xylene solution B of a phosphorescent light emitting composition, formed by adding a phosphorescent light emitting organic compound 2 to a polymer compound 3 in a ratio of 30% by weight, was prepared. Next, in a nitrogen atmosphere where oxygen concentration and moisture concentration were each controlled to 10 ppm or less in terms of a volume, the xylene solution B was applied onto the hole transport layer by a spin coating method to form a thin film for a light emitting layer, which had a thickness of 100 nm. Further, in moist nitrogen controlled to have an oxygen concentration of 10 ppm or less in terms of a volume and an absolute humidity of $1.3 \times 10^{-2}$ kg/kg (DA) in terms of a weight, the thin film was stored for 30 minutes to form an organic layer. Storage of the organic thin film was performed at room temperature (25° C.).

Further, in a nitrogen atmosphere where oxygen concentration and moisture concentration were each controlled to 10 ppm or less in terms of a volume, the organic layer was baked at 130° C. for 10 minutes. Baking of the organic layer was performed in an atmosphere of atmospheric pressure. The organic layer functions as a light emitting layer. In formation of the hole transport layer and the light emitting layer, pressure in steps of forming and baking the thin film was atmospheric pressure.

Next, pressure was reduced to $1.0 \times 10^{-4}$ Pa or less, barium was then deposited in a thickness of about 5 nm as a cathode, and aluminum was then deposited in a thickness of about 80 nm. After deposition, sealing was performed using a glass substrate to prepare an organic EL device.

The prepared organic EL device emitted green light (CIE1931: (0.32, 0.63)), and when constant current driving was performed at an initial luminance of 8000 cd/m$^2$, time until luminance became 75% of initial luminance (luminance 75% life) was 17.4 hours.

Example 4

An organic EL device was prepared by the same method as that in Example 3 except that in formation of an organic layer, a thin film was stored in moist nitrogen controlled to have an oxygen concentration of 10 ppm or less in terms of a volume and an absolute humidity of $7.5 \times 10^{-3}$ kg/kg (DA).

The prepared organic EL device emitted green light (CIE1931: (0.32, 0.63)), and when constant current driving was performed at an initial luminance of 8000 cd/m$^2$, time until luminance became 75% of initial luminance (luminance 75% life) was 14.3 hours.

Comparative Example 2

An organic EL device was prepared by the same method as that in Example 3 except that storage of a thin film in moist nitrogen was not performed.

The prepared organic EL device emitted green light (CIE1931: (0.32, 0.63)), and when constant current driving was performed at an initial luminance of 8000 cd/m$^2$, time until luminance became 75% of initial luminance (luminance 75% life) was 9.8 hours.

Synthesis Example 1

Synthesis of Polymer Compound 4

Under an inert atmosphere, 2,7-bis(1,3,2-dioxaborolane-2-yl)-9,9-dioctylfluorene (5.20 g), bis(4-bromophenyl)-(4-secondary-butylphenyl)-amine (4.50 g), palladium acetate (2.2 mg), tri(2-methylphenyl)phosphine (15.1 mg), Aliquat 336 (0.91 g, manufactured by Aldrich, Inc.) and toluene (70 ml) were mixed, and the mixture was heated to 105° C. To this reaction solution was added dropwise a 2 wt mol aqueous sodium carbonate solution (19 ml), and the mixture was refluxed for 4 hours. After reaction, phenylboric acid (121 mg) was added, and the mixture was further refluxed for 3 hours. Then, an aqueous sodium diethyldithiacarbamate solution was added, and the mixture was stirred at 80° C. for 4 hours. The mixture was cooled, then washed with water (60 ml) three times, a 3 wt % aqueous acetic acid solution (60 ml) three times and water (60 ml) three times, and purified by passage through an alumina column and a silica gel column. The resulting toluene solution was added dropwise to methanol (3 L), the mixture was stirred for 3 hours, and the resulting solid was then filtered and dried. The yield of the resulting polymer compound 4 was 5.25 g.

The polymer compound 4 had a polystyrene equivalent number average molecular weight of $1.2 \times 10^5$ and a polystyrene equivalent weight average molecular weight of $2.6 \times 10^5$.

From a charged raw material, the polymer compound 4 is thought to be a polymer having repeating units represented by the formula:

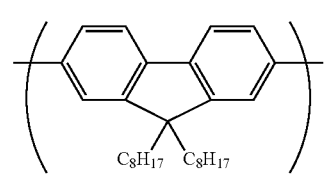

[Formula 1]

and the formula:

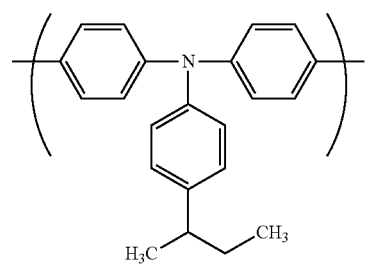

[Formula 2]

at a ratio of 1:1 (molar ratio).

Synthesis Example 2

Synthesis of Polymer Compound 5

To a 200 mL separable flask to which a Dimroth condenser was connected were added 3.18 g (6.0 mmol) of 9,9-dioctylfluorene-2,7-diboric acid ethylene glycol ester, 3.06 g (5.4 mmol) of 9,9-dioctyl-2,7-dibromofluorene, 0.44 g (0.6 mmol) of N,N'-bis(4-bromophenyl)-N,N'-bis(2,6-dimethyl-4-tert-butylphenyl)-1,4-phenylenediamine, 0.82 g of methyltrioctylammonium chloride (trade name: Aliquat 336 (registered trademark), manufactured by Aldrich, Inc.) and 60 mL of toluene. Under a nitrogen atmosphere, 4.2 mg of bistriphenylphosphine palladium dichloride was added, and the mixture was heated to 85° C. The resulting solution was heated to 105° C. while 16.3 mL of a 17.5 wt % aqueous sodium carbonate solution was added dropwise, and the mixture was then stirred for 1.5 hours. Next, 0.74 g of phenylboric acid, 4.2 mg of bistriphenylphosphine palladium dichloride and 30 mL of toluene were added, and the mixture was stirred at 105° C. for 17 hours. The aqueous layer was removed from the resulting solution, 3.65 g of sodium N,N-diethyldithiocarbamate trihydrate and 36 mL of ion-exchanged water, and the mixture was stirred at 85° C. for 2 hours. The organic layer was separated from the aqueous layer, and the organic layer was then washed with 80 mL of ion-exchanged water (two times), 80 mL of a 3 wt % aqueous acetic acid solution (two times) and 80 mL of ion-exchanged water (two times) in this order. When the washed organic layer was added dropwise to 930 mL of methanol, a precipitate was generated, and then the precipitate was filtered and then dried to obtain a solid. When the solid was dissolved in 190 mL of toluene to prepare a solution, the solution was passed through a silica gel/alumina column through which toluene had been passed, and the resulting solution was added dropwise to 930 mL of methanol, a precipitate was generated, and then the precipitate was filtered and then dried to obtain a polymer compound 5 (4.17 g) having repeating units represented by the following formula at the following molar ratio in terms of a theoretical value determined from a charge raw material. The polymer compound 5 had a polystyrene equivalent number average molecular weight (Mn) of $2.7 \times 10^5$ and a polystyrene equivalent weight average molecular weight (Mw) of $7.1 \times 10^5$.

Synthesis Example 3

Synthesis of Compound M-1

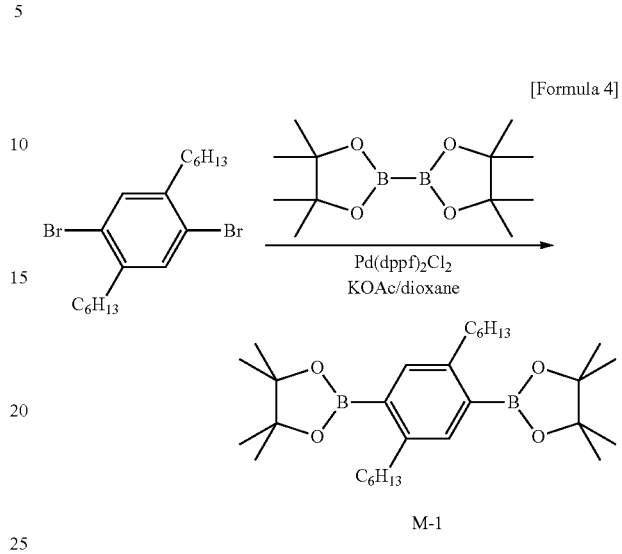

[Formula 4]

8.08 g of 1,4-dihexyl-2,5-dibromobenzene, 12.19 g of bis(pinacolate)diboron and 11.78 g of potassium acetate were put in a 300 ml four-necked flask, and the interior of the flask was purged with argon. 100 ml of dehydrated 1,4-dioxane was placed therein, and the mixture was degassed with argon. 0.98 g of [1,1'-bis(diphenylphosphino)ferrocene]dichloropalladium (II) (Pd(dppf)$_2$Cl$_2$) was placed, and the mixture was further degassed with argon, and heated to reflux for 6 hours. Toluene was added thereto, and the mixture was washed with ion-exchanged water. To the washed organic layer were added anhydrous sodium sulfate and activated carbon, and the mixture was filtered using a funnel precoated with Celite. The resulting filtrate liquid was concentrated to obtain 11.94 g of a dark brown crystal. The crystal was recrystallized with n-hexane, and the crystal was washed with methanol. The resulting crystal was dried under reduced pressure to obtain 4.23 g of a white acicular crystal as a compound M-1 (yield 42%).

$^1$H-NMR (300 MHz, CDCl$_3$): δ 0.88 (t, 6H), 1.23-1.40 (m, 36H), 1.47-1.56 (m, 4H), 2.81 (t, 4H), 7.52 (s, 2H)

LC-MS (ESI, positive): m/z$^+$=573 [M+K]$^+$

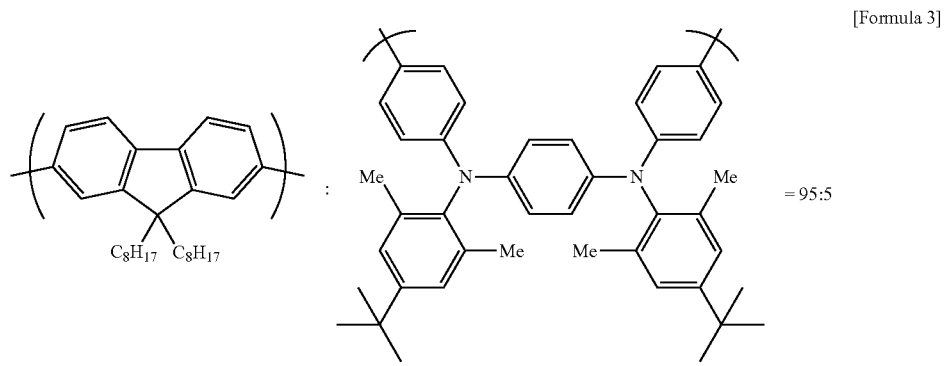

[Formula 3]

Synthesis Example 4

Synthesis of Polymer Compound 6

Under a nitrogen atmosphere, 3.13 g of the compound M-1, 3.58 g of 2,7-dibromo-9,9-dioctylfluorene, 2.2 mg of palladium (II) acetate, 13.4 mg of tris(2-methoxyphenyl)phosphine and 80 mL of toluene were mixed, and the mixture was heated to 100° C. To the reaction solution was added dropwise 21.5 ml of a 20 wt % aqueous tetraethyl ammonium hydroxide solution, and the mixture was refluxed for 4.5 hours. After reaction, thereto were added 78 mg of phenylboric acid, 2.2 mg of palladium (II) acetate, 13.4 mg of tris(2-methoxyphenyl)phosphine, 20 mL of toluene and 21.5 ml of a 20 wt % aqueous tetraethyl ammonium hydroxide solution, and the mixture was further refluxed for 15 hours. Then, thereto was added 70 ml of a 0.2 M aqueous sodium diethyldithiocarbamate solution was added, and the mixture was stirred at 85° C. for 2 hours. The reaction solution was cooled to room temperature, and washed with 82 ml of water three times, 82 ml of a 3 wt % aqueous acetic acid solution three times and 82 ml of water three times. When the organic layer was added dropwise to 1200 ml of methanol, a precipitate was generated, and the precipitate was filtered and then dried to obtain a solid. The solid was dissolved in toluene, and purified by passing the solution through an alumina column and a silica gel column. The resulting eluate liquid was added dropwise to 1500 ml of methanol to obtain 3.52 g of a polymer compound 6. The polymer compound 6 had a polystyrene equivalent number average molecular weight of $3.0 \times 10^5$ and a polystyrene equivalent weight average molecular weight of $8.4 \times 10^5$.

The polymer compound 6 is a copolymer composed of a repeating unit represented by the following formula:

[Formula 5]

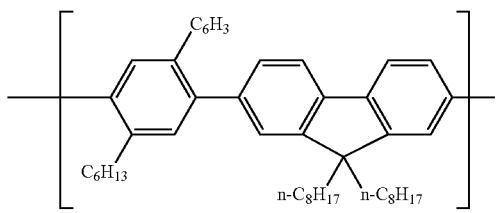

Example 5 and Comparative Example 3

An organic EL device is produced in the same manner as in Example 1 except that the polymer compound 4 synthesized in Synthesis Example 1 is used in place of the polymer compound 1, a phosphorescent light emitting compound 3 synthesized in accordance with the method described in International Publication No. WO 2002/44189 and represented by the following formula:

[Formula 6]

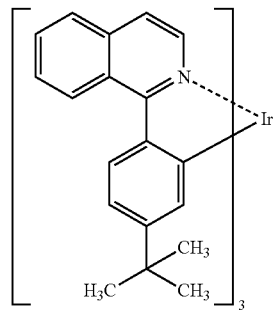

is used in place of the phosphorescent light emitting organic compound 1, the polymer compound 5 synthesized in Synthesis Example 2 is used in place of the polymer compound 2, and a xylene solution C of a phosphorescent light emitting composition formed by adding the phosphorescent light emitting organic compound 3 to the polymer compound 5 in a ratio of 5.0% by weight is used (Example 5). An organic EL device is produced in the same manner as in Comparative Example 1 except that the polymer compound 4 synthesized in Synthesis Example 1 is used in place of the polymer compound 1, the phosphorescent light emitting compound 3 is used in place of the phosphorescent light emitting organic compound 1, the polymer compound 5 synthesized in Synthesis Example 2 is used in place of the polymer compound 2, and the xylene solution C of a phosphorescent light emitting composition formed by adding the phosphorescent light emitting organic compound 3 to the polymer compound 5 in a ratio of 5.0% by weight is used (Comparative Example 3).

Both the devices prepared emit red light. When the characteristics of those organic EL devices are measured in the same manner as in Example 1, a significant improvement is observed in the organic EL device of Example 5 as compared to the organic EL device of Comparative Example 3 at least for time until luminance becomes 75% of initial luminance (luminance 75% life) when constant current driving is performed at an initial luminance of 12000 cd/m$^2$.

Example 6 and Comparative Example 4

An organic EL device is produced in the same manner as in Example 3 except that the polymer compound 4 synthesized in Synthesis Example 1 is used in place of the polymer compound 1, a phosphorescent light emitting compound 4 ((Iridium (III) tris(2-(4-tolyl)pyridinato-N,C2), manufactured by American Dye Source Inc., trade name: ADS 066GE) represented by the following formula:

[Formula 7]

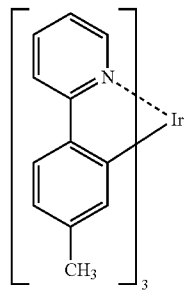

is used in place of the phosphorescent light emitting organic compound 2, the polymer compound 6 synthesized in Synthesis Example 4 is used in place of the polymer compound 3, and a xylene solution D of a phosphorescent light emitting composition formed by adding the phosphorescent light emitting organic compound 4 to the polymer compound 6 in a ratio of 5.0% by weight is used (Example 6). An organic EL device is produced in the same manner as in Comparative Example 2 except that the polymer compound 4 synthesized in Synthesis Example 1 is used in place of the polymer compound 1, the phosphorescent light emitting compound 4 is used in place of the phosphorescent light emitting organic compound 2, the polymer compound 6 synthesized in Synthesis Example 4 is used in place of the polymer compound 3, and the xylene solution D of a phosphorescent light emitting composition formed by adding the phosphorescent light emitting organic compound 4 to the polymer compound 6 in a ratio of 5.0% by weight is used (Comparative Example 4).

Both the devices prepared emit green light. When the characteristics of those organic EL devices are measured in the same manner as in Example 3, a significant improvement is observed in the organic EL device of Example 6 as compared to the organic EL device of Comparative Example 4 at least for time until luminance becomes 75% of initial luminance (luminance 75% life) when constant current driving is performed at an initial luminance of 8000 cd/m².

Synthesis Example 7

Synthesis of Polymer Compound 7

Under an inert gas atmosphere, 2,7-dibromo-9,9-di(octyl)fluorene (9.0 g, 16.4 mmol), N,N'-bis(4-bromophenyl)-N,N'-bis(4-t-butyl-2,6-dimethylphenyl)1,4-phenylenediamine (1.3 g, 1.8 mmol), 2,7-bis(4,4,5,5-tetramethyl-1,3,2-dioxaborolane-2-yl)-9,9-di(4-hexylphenyl)fluorene (13.4 g, 18.0 mmol), tetraethyl ammonium hydroxide (43.0 g, 58.3 mmol), palladium acetate (8 mg, 0.04 mmol), tri(2-methoxyphenyl)phosphine (0.05 g, 0.1 mmol) and toluene (200 mL) were mixed, and the mixture was heated/stirred at 90° C. for 8 hours. Then, phenylboronic acid (0.22 g, 1.8 mmol) was added, the resulting mixture was stirred for 14 hours. After the mixture was allowed to cool, the aqueous layer was removed, an aqueous sodium diethyldithiocarbamate solution was added, the mixture was stirred, the aqueous layer was then removed, and the organic layer was washed with water and 3% aqueous acetic acid. The organic layer was poured into methanol to precipitate a polymer, the polymer was then filtered and dissolved in toluene again, and the solution was passed through columns of silica gel and alumina. The eluted toluene solution containing the polymer was collected, and the collected toluene solution was poured into methanol to precipitate the polymer. The precipitated polymer was vacuum-dried at 50° C. to obtain a polymer compound 7 (12.5 g). Gel-permeation chromatography showed that the resulting polymer compound 7 had a polystyrene equivalent weight average molecular weight of $3.1 \times 10^5$ and a molecular weight distribution index (Mw/Mn) of 2.9.

The polymer compound 7 is a copolymer containing a constitutional unit represented by the following formula:

[Formula 8]

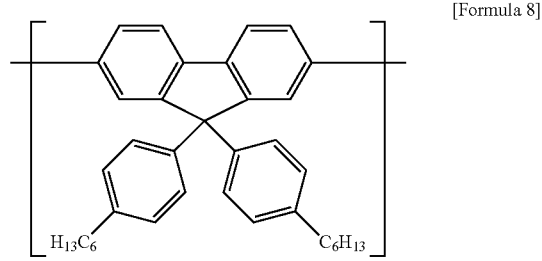

a constitutional unit represented by the following formula:

[Formula 9]

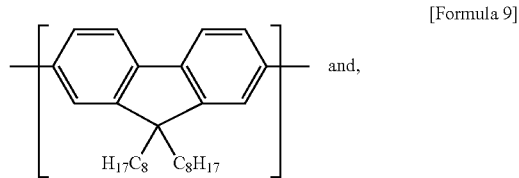

and, a constitutional unit represented by the following formula:

[Formula 10]

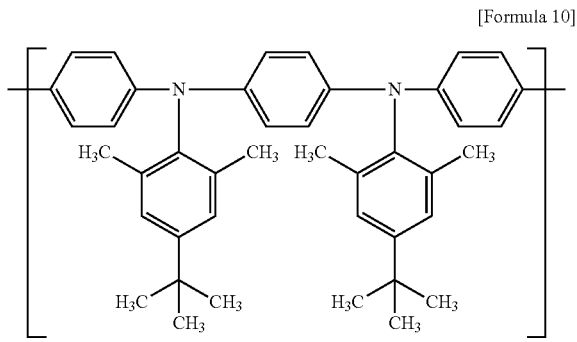

at a molar ratio of 50:45:5.

Synthesis Example 6

Synthesis of Phosphorescent Light Emitting Compound 5

The phosphorescent light emitting compound 5 represented by the following formula was synthesized in accordance with the method described in Japanese Patent Laid-open Publication No. 2006-188673.

[Formula 11]

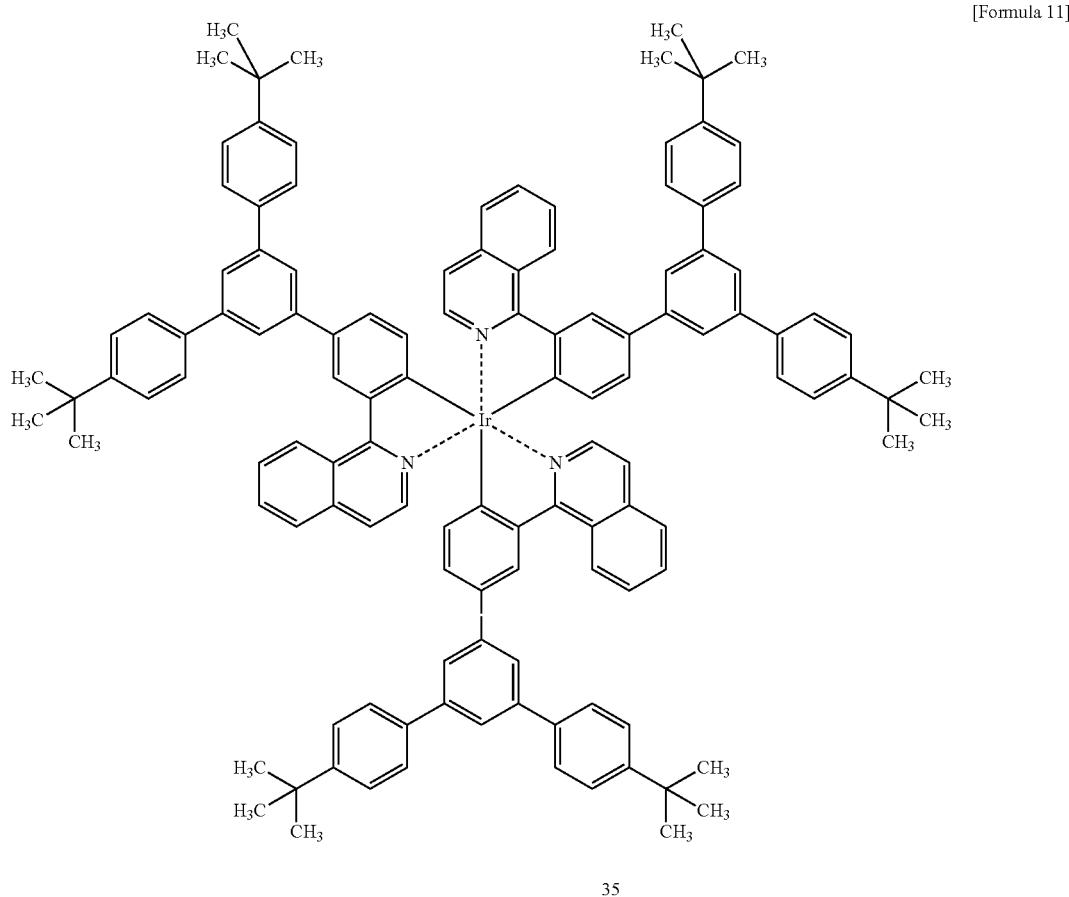

Example 7

An organic EL device was prepared by the following method.

To a glass substrate on which an ITO film (anode) having a thickness of 45 nm was formed by a sputtering method, a suspension liquid of poly(3,4)ethylenedioxythiophene/polystyrenesulfonic acid (Baytron P manufactured by Starck, Inc.) was applied by a spin coating method to form a thin film having a thickness of 65 nm, and heating was performed on a hot plate at 200° C. for 10 minutes to bake the thin film, thereby obtaining a hole injection layer. In formation of the hole injection layer, steps of forming and baking the thin film were performed in an air atmosphere.

Next, a polymer compound 4 as a hole transport material was dissolved in xylene to prepare a xylene solution 2. Concentration of the polymer compound 4 in the xylene solution 2 was 0.8% by weight. Next, in a nitrogen atmosphere where oxygen concentration and moisture concentration were each controlled to 10 ppm or less in terms of a volume ratio, the xylene solution 2 was applied onto the hole injection layer by a spin coating method to form a thin film for a hole transport layer, which had a thickness of 20 nm, and in a nitrogen atmosphere where oxygen concentration and moisture concentration were each controlled to 10 ppm or less in terms of a volume ratio, heating was performed at 200° C. for 1 hour to bake the thin film, thereby obtaining a hole transport layer.

Next, a 1.3 wt % xylene solution E of a mixture formed by adding a phosphorescent light emitting organic compound 5 to the polymer compound 7 in a ratio of 5% by weight was prepared. Next, in a nitrogen atmosphere where oxygen concentration and moisture concentration were each controlled to 10 ppm or less in terms of a volume ratio, the xylene solution E was applied onto the hole transport layer by a spin coating method to form a thin film for a light emitting layer, which had a thickness of 65 nm. Further, in moist nitrogen controlled to have an oxygen concentration of 10 ppm or less in terms of a volume ratio and an absolute humidity of $9.9 \times 10^{-3}$ kg/kg (DA) in terms of a weight, the thin film was stored at room temperature (25° C.) for 30 minutes to form an organic layer. Further, in a nitrogen atmosphere where oxygen concentration and moisture concentration were each controlled to 10 ppm or less in terms of a volume ratio, the organic layer was baked at 130° C. for 10 minutes. The organic layer functions as a light emitting layer. In formation of the hole transport layer and the light emitting layer, pressure in steps of forming and baking the thin film was atmospheric pressure.

As a cathode, barium was deposited in a thickness of about 5 nm, and aluminum was then deposited in a thickness of about 80 nm to prepare an organic EL device. Deposition of the metal was started after the degree of vacuum reached $1 \times 10^{-4}$ Pa or less.

The prepared organic EL device emitted red light (CIE1931: (0.65, 0.32)), and when constant current driving was performed at an initial luminance of 12000 cd/m$^2$, time until luminance became 75% of initial luminance (luminance 75% life) was 16.9 hours.

Comparative Example 5

An organic EL device was prepared by the same method as that in Example 7 except that storage of a thin film in moist nitrogen was not performed.

The prepared organic EL device emitted red light (CIE1931: (0.65, 0.32), and when constant current driving was performed at an initial luminance of 12000 cd/m², time until luminance became 75% of initial luminance (luminance 75% life) was 15.3 hours.

DESCRIPTION OF REFERENCE SIGNS 1, 1' Organic EL device
2 Substrate
3 First electrode
4 First organic layer
5 Second organic layer
6 Organic layer
6' Third organic layer
7 Second electrode
11 Space for performing organic thin film forming step
12 Space for performing organic thin film storing step
13 Buffer space
14 Substrate

The invention claimed is:

1. A method for producing an organic electroluminescence device comprising: a first electrode; a second electrode; and an organic layer provided between the first electrode and the second electrode, the organic layer comprising an organic compound,
wherein the organic layer is formed by a method comprising:
forming, by a coating method, an organic thin film including an organic compound on a surface of a layer on which the organic layer is formed, under a low-humidity atmosphere having a moisture concentration of 10 ppm or less in terms of a volume; and
storing the organic thin film obtained by the forming, under a high-humidity atmosphere having an absolute humidity of $2.0 \times 10^{-3}$ kg/kg (dry air) or more in terms of a weight to accumulate moisture on a surface of the organic layer.

2. The method for producing an organic electroluminescence device according to claim 1, wherein the absolute humidity is $2.0 \times 10^{-2}$ kg/kg (dry air) or less in terms of the weight.

3. The method for producing an organic electroluminescence device according to claim 1, wherein the absolute humidity is $5.0 \times 10^{-3}$ kg/kg (dry air) or more and $1.5 \times 10^{-2}$ kg/kg (dry air) or less in terms of the weight.

4. The method for producing an organic electroluminescence device according to claim 1, wherein the low-humidity atmosphere has an oxygen concentration of 10 ppm or less in terms of a volume.

5. The method for producing an organic electroluminescence device according to claim 1, wherein
the forming and the storing are performed by passing a substrate sequentially through a space of atmosphere for performing the forming, a buffer space, and a space of atmosphere for performing the storing, and
an atmospheric pressure of the buffer space is negative pressure as compared to each of the space for performing the forming and the space for performing the storing.

6. The method for producing an organic electroluminescence device according to claim 1, wherein
the forming and the storing are performed by passing a substrate sequentially through a space of atmosphere for performing the forming and a space of atmosphere for performing the storing, and an atmospheric pressure of the space for performing the forming is positive pressure as compared to the space for performing the storing.

7. The method for producing an organic electroluminescence device according to claim 1, wherein the method further comprises:
baking the organic thin film subsequently to the storing.

8. The method for producing an organic electroluminescence device according to claim 7, wherein the baking is performed under an atmosphere containing an inert gas.

9. The method for producing an organic electroluminescence device according to claim 7, wherein the baking is performed under an atmosphere having an oxygen concentration of 10 ppm or less and a moisture concentration of 10 ppm or less in terms of a volume.

10. The method for producing an organic electroluminescence device according to claim 7, wherein the baking is performed under a reduced-pressure atmosphere having a pressure of 10 Pa or less.

11. The method for producing an organic electroluminescence device according to claim 1, wherein the first electrode is an anode, and the second electrode is a cathode.

12. The method for producing an organic electroluminescence device according to claim 1, wherein the organic layer contains a polymer organic compound.

13. The method for producing an organic electroluminescence device according to claim 1, wherein the organic layer is a light emitting layer.

14. The method for producing an organic electroluminescence device according to claim 13, wherein the method further comprises:
forming a functional layer in contact with the light emitting layer.

15. The method for producing an organic electroluminescence device according to claim 14, wherein the functional layer is formed between the light emitting layer and the first electrode.

16. The method for producing an organic electroluminescence device according to claim 14, wherein the functional layer contains a polymer organic compound.

17. The method for producing an organic electroluminescence device according to claim 1, wherein the organic layer contains a phosphorescent light emitting compound.

18. An organic electroluminescence device which is produced by the method for producing an organic electroluminescence device according to claim 1.

19. A planar light source comprising the organic electroluminescence device according to claim 18.

20. A display device comprising the organic electroluminescence device according to claim 18.

21. The method for producing an organic electroluminescence device according to claim 1, further comprising:
forming a functional layer on the surface of the organic layer, wherein
the moisture accumulated on the surface of the organic layer changes the resistance between the organic thin film and the functional layer.

22. The method for producing an organic electroluminescence device according to claim 1, further comprising:
forming an electrode which is one of the first electrode and the second electrode on the surface of the organic layer, wherein
the moisture accumulated on the surface of the organic layer degrades the electrode.

23. The method for producing an organic electroluminescence device according to claim 1, wherein the low-humidity atmosphere contains an inert gas.

* * * * *